United States Patent
Kobayashi (10) Patent No.: US 10,026,802 B1
(45) Date of Patent: Jul. 17, 2018

(54) SEMICONDUCTOR DEVICE AND METHOD OF MANUFACTURING THE SEMICONDUCTOR DEVICE

(71) Applicant: SII Semiconductor Corporation, Chiba-shi, Chiba (JP)

(72) Inventor: Naoto Kobayashi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/825,862

(22) Filed: Nov. 29, 2017

(30) Foreign Application Priority Data

Jan. 17, 2017 (JP) ................................. 2017-005909

(51) Int. Cl.
*H01L 21/02* (2006.01)
*H01L 49/02* (2006.01)
*H01L 21/66* (2006.01)

(52) U.S. Cl.
CPC .............. *H01L 28/24* (2013.01); *H01L 22/20* (2013.01)

(58) Field of Classification Search
CPC ................................ H01L 28/24; H01L 22/20
See application file for complete search history.

(56) References Cited

U.S. PATENT DOCUMENTS

| | | | | |
|---|---|---|---|---|
| 5,257,005 A | * | 10/1993 | Desroches | H01L 29/8605 257/E27.047 |
| 6,732,422 B1 | * | 5/2004 | Thei | H01C 7/006 257/E21.004 |
| 2004/0183157 A1 | * | 9/2004 | Wada | H01L 27/0629 257/538 |
| 2011/0309466 A1 | * | 12/2011 | Nanba | H01L 21/761 257/503 |
| 2014/0231952 A1 | * | 8/2014 | Hahn | H01L 28/20 257/489 |
| 2015/0108608 A1 | * | 4/2015 | Chakraborty | H01L 23/5384 257/538 |

FOREIGN PATENT DOCUMENTS

JP    2012-33641 A    2/2012

* cited by examiner

*Primary Examiner* — Victor A Mandala
(74) *Attorney, Agent, or Firm* — Brinks Gilson & Lione (57) ABSTRACT

Provided is a semiconductor device having a resistor including silicide layers and a polysilicon layer with impurities, and the resistor includes a plurality of boundary surfaces between the silicide layers and the polysilicon layer in a longitudinal direction of the resistor, permitting correction with one photomask when a resistance value of a resistor is deviated from a design value while suppressing upsizing of a semiconductor device. Further, provided is a method of manufacturing the semiconductor device, in which the resistance value is adjusted by changing one mask for forming the silicide layers to change the number of boundary surfaces between the silicide layers and the polysilicon layer, and change a length of the polysilicon layer.

12 Claims, 6 Drawing Sheets

SEMICONDUCTOR DEVICE AND METHOD OF MANUFACTURING THE SEMICONDUCTOR DEVICE

RELATED APPLICATIONS

This application claims priority under 35 U.S.C. § 119 to Japanese Patent Application No. 2017-005909 filed on Jan. 17, 2017, the entire content of which is hereby incorporated by reference.

BACKGROUND OF THE INVENTION

1. Field of the Invention

The present invention relates to a semiconductor device and a method of manufacturing the semiconductor device, and more particularly, to a semiconductor device including a resistor and a method of manufacturing the semiconductor device.

2. Description of the Related Art

Examples of a resistor used in a semiconductor device include a diffusion resistor, made of a single crystal silicon semiconductor substrate into which impurities having a conductivity type opposite to that of the semiconductor substrate are injected, and a polysilicon resistor made of polysilicon into which impurities are injected.

Since a resistance value of the polysilicon resistor is determined multiply by a plurality of manufacturing conditions, such as a film thickness and a formation condition of a polysilicon layer, and ion species and concentration of introduced impurities, a desired resistance value may not be obtained in some cases. In view of the circumstances above, there has been proposed a technology to correct the resistance value of the polysilicon resistor in a case where the resistance value is deviated from a desired design value.

Figure 8:
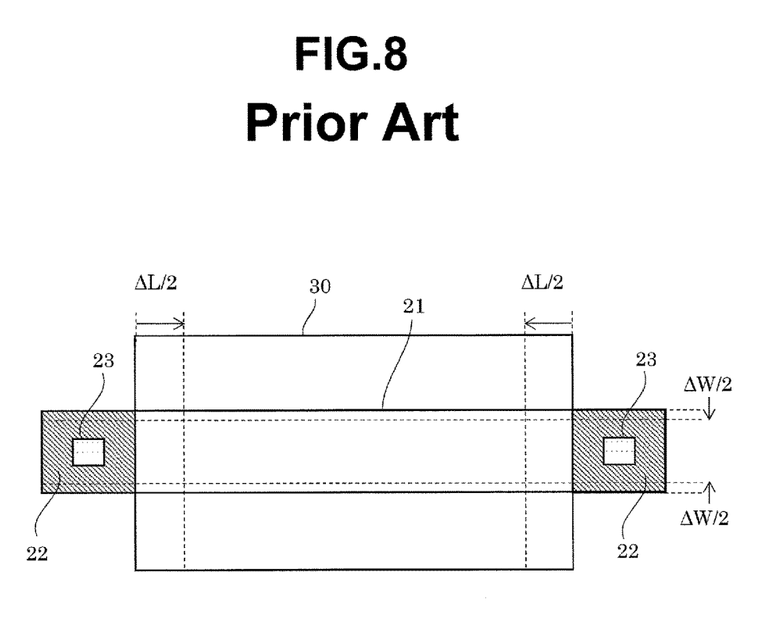
FIG. 8 is a plan view for illustrating a related-art semiconductor device.

For example, in Japanese Patent Application Laid-open No. 2012-33641, there is disclosed a method of setting the resistance value of the polysilicon resistor having both ends formed of silicide as illustrated in FIG. 8. In a technology disclosed in Japanese Patent Application Laid-open No. 2012-33641, when the resistance value becomes higher than a design value, the resistance value is reduced through correction of broadening a formation range of the silicide layers 22 from each side of the both ends by ΔL/2, the silicide layers 22 are formed at the both ends of the rectangular polysilicon resistor in a longitudinal direction. Further, when the resistance value becomes lower than the design value, the resistance value is increased through correction of narrowing a width of a polysilicon layer 21 from both sides by ΔW/2. In this manner, the resistance value of the polysilicon resistor is corrected through adjustment of the formation range of a silicide block film 30 for suppressing silicidation, or adjustment of the width of the polysilicon layer 21 in order to define the silicide regions 22. Accordingly, the resistance value can be corrected without affecting surrounding patterns or a wiring layout.

When there occurs a case in which the resistance value of some resistors are high and the resistance value of some resistors are low in one semiconductor device, two photomasks, one for forming the polysilicon resistor and one for forming the silicide layer, should be modified. Thus, a development cost increases. Moreover, there is a need to manufacture the semiconductor device by changing design from a polysilicon formation step previous to a silicide layer formation step, with the result that a development period is unavoidably prolonged.

SUMMARY OF THE INVENTION

It is an object of the present invention to provide a semiconductor device in which increase in development cost and prolongation of a development period are suppressed in a case of correction of a resistance value, and a method of manufacturing the semiconductor device.

The present invention is directed to the following semiconductor device and method of manufacturing the semiconductor device.

Specifically, there is provided a semiconductor device: including a resistor having a substantially rectangular shape, the resistor including: a polysilicon layer, which includes impurities; contact regions, which are formed at both ends of the resistor, and include contact portions electrically connected to an upper wiring; and a silicide layer formed at least at one region other than the contact regions, being in contact with the polysilicon layer via a boundary surface having a predetermined resistance value, and having a width equal to a width of the polysilicon layer.

Further, there is provided a method of manufacturing a semiconductor device, including: measuring a resistance value of the resistor in the semiconductor device described above; and adjusting the resistance value so as to be equal to a design value by increasing a number of the silicide layers when the resistance value is lower than the design value, and by reducing the number of the silicide layers when the resistance value is higher than the design value.

The present invention adopts the following structure: the silicide layer is formed at the portion outside the contact regions in the resistor, and the boundary surface having a predetermined resistance value is formed between the polysilicon layer including the impurities and the silicide layer. It is, thus, possible to adjust the resistance value of the resistor by increasing or reducing the number of boundary surfaces. Accordingly, the design change can be performed only by modifying one photomask in the silicide layer formation step included in the latter half of the manufacturing process when the resistance value of the resistor is deviated from the design value, suppressing the increase in development cost and the prolongation of the development period.

DETAILED DESCRIPTION OF THE PREFERRED EMBODIMENTS

Referring to the accompanying drawings, semiconductor devices according to embodiments of the present invention are described below.

Figure 1A:
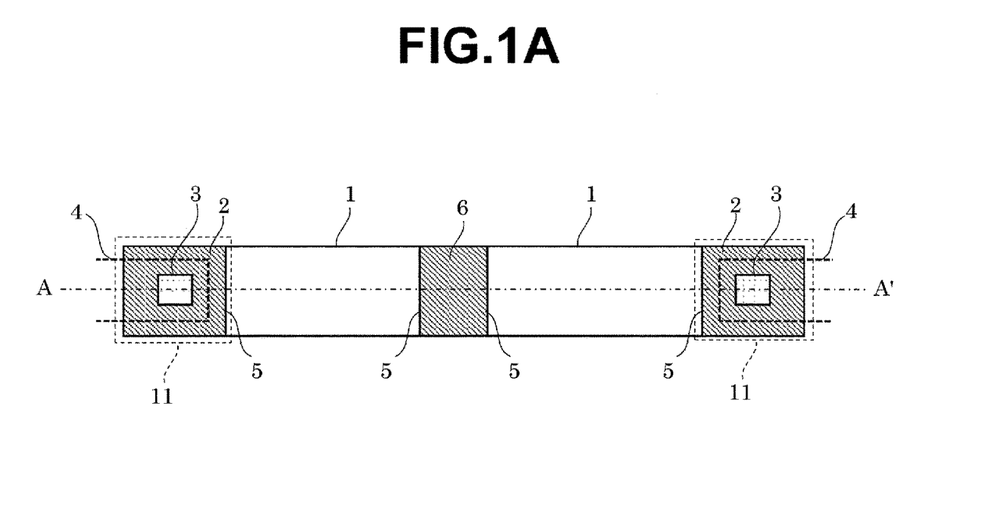
FIG. 1A is a plan view for illustrating a semiconductor device according to a first embodiment of the present invention.
Figure 1B:
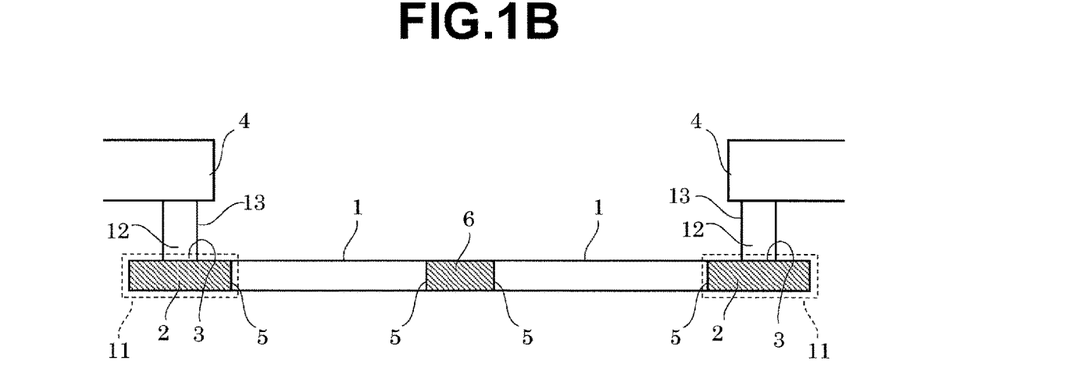
FIG. 1B is a sectional view for illustrating the semiconductor device illustrated in FIG. 1A.

FIG. 1A is a plan view for illustrating a resistor according to a first embodiment of the present invention. FIG. 1B is a sectional view taken along the line A-A' of FIG. 1A.

The resistor according to the first embodiment includes polysilicon layers 1, contact portions 3, contact regions 11 including the contact portions 3, silicide layers 2 formed in the contact regions 11, and a silicide layer 6 formed in a portion other than the contact regions 11. Further, the resistor has a rectangular shape.

Impurities, such as boron or phosphorus, are injected into the polysilicon layers 1 so that the polysilicon layers 1 have conductivity as the resistor. The contact regions 11 are regions which are positioned at both ends of the rectangular resistor in a longitudinal direction and include the contact portions 3. The contact portions 3 are portions at which contact plugs 12 formed in contact holes 13 and the contact regions 11 are in contact with each other. In order to reduce a contact resistance between the resistor and the contact plugs 12, the contact regions 11 are made into the silicide layers 2 after silicidation of the polysilicon layer 1 by a high-melting-point metal. The silicide layer 6 is formed for adjustment of a resistance value of the resistor, which is described later.

As illustrated in FIG. 1B, the resistor is connected to upper metal wirings 4 through intermediation of the contact plugs 12 by embedding the contact plugs 12 into the contact holes 13 at both ends of the resistor. However, the method of connecting the resistor to the upper metal wirings 4 is not particularly limited thereto. Further, as illustrated in FIG. 1B, the silicide layers 2 and the silicide layer 6 of the first embodiment are formed by complete silicidation of corresponding parts of the polysilicon layer 1 from a front surface to a bottom surface in a thickness direction with the high-melting-point metal. In this manner, boundary surfaces 5 having a predetermined resistance value are formed between the polysilicon layers 1 and the silicide layers 2 and 6. That is, the resistor of the first embodiment has a structure in which the polysilicon layers 1 and the silicide layers 2 and 6, which are formed by complete silicidation of the corresponding parts of the polysilicon layer 1, are alternately positioned in the longitudinal direction of the resistor via the boundary surfaces 5 therebetween.

Next, with reference to FIG. 2A to FIG. 2D, description is made of a manufacturing process to achieve the structure illustrated in FIG. 1A and FIG. 1B.

Figure 2A:
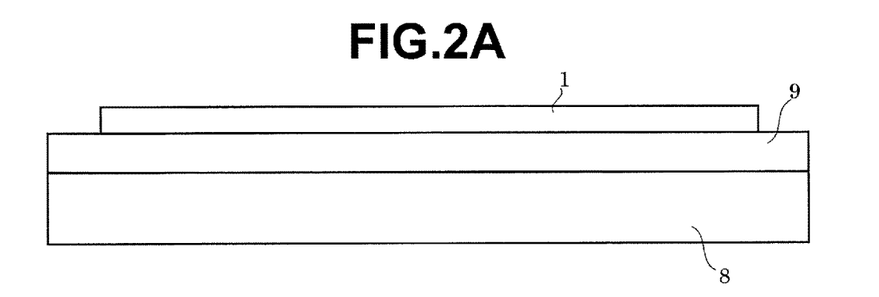
FIG. 2A, FIG. 2B, FIG. 2C, and FIG. 2D are views for illustrating a flow of steps in a manufacturing process of the semiconductor device illustrated in FIG. 1A and FIG. 1B.

First, as illustrated in FIG. 2A, an insulating film 9, for example, a LOCOS oxide film, is formed on a semiconductor substrate 8, and then the polysilicon layer 1 forming the resistor of the first embodiment is formed by, for example, an LP-CVD method.

In order to completely silicide a part of the polysilicon layer 1 from the front surface to the bottom surface afterwards, it is preferred that the polysilicon layer 1 have a film thickness of from 50 nm to 150 nm. When the film thickness exceeds this range, it is difficult to completely silicide the polysilicon layer 1. When the film thickness falls below this range, film thickness stability and impurity concentration stability in polysilicon are reduced. Accordingly, it is preferred that the film thickness of the polysilicon layer 1 be determined within this range.

Next, impurity injection for determining resistivity of the polysilicon layer 1 is performed with respect to the entire polysilicon layer 1. As the impurities, P-type impurities, for example, boron, or N-type impurities, for example, phosphorus, are selected in accordance with the purpose.

For example, in a case where suppression of characteristic variation, for example, variation in temperature coefficient of the resistance value, is required, the P-type impurities, for example, boron, are preferred. Meanwhile, in a case where the resistance value of the polysilicon layer 1 is desired to be relatively lower than the resistance value of the boundary surfaces 5 (FIG. 2D) to be formed later, it is preferred to adopt the N-type impurities, such as phosphorus and arsenic, which have a high mobility and hence may have a low resistivity, as the impurities to be introduced into the polysilicon layer 1.

Further, an amount of impurity injection is set so as to have an impurity concentration of $1 \times 10^{18}/cm^3$ or more in the polysilicon layer 1. When the impurity concentration is less than $1 \times 10^{18}/cm^3$, the resistance value of the boundary surfaces 5 rises to exceed an adjustment range, and is liable to be varied, thereby not being preferred to the resistance value adjusting method of the first embodiment. Meanwhile, in order to set the resistance value of the boundary surfaces 5 to a predetermined value or more that is suitable for adjustment, the impurity concentration is preferred to be set to $1 \times 10^{21}/cm^3$ or less. The reason why the resistance value of the boundary surfaces 5 rises along with decrease in impurity concentration lies in that the impurities start to transition from an ohmic junction, which has linear current and voltage characteristics and a low resistance value, and is formed when the impurities have a high concentration, to a Schottky junction, which has a high resistance value, is based on a potential barrier, and is formed when the impurities have a low concentration. In the first embodiment, in order to set the resistance value of the boundary surfaces 5 to a value suitable for the adjustment, there is employed a state in which boundary surfaces 5 has the resistance value increasing to a predetermined value before reaching the complete Schottky junction, and in which the linear current and voltage characteristics are maintained.

After that, through use of the photolithography technology and the etching technology, the polysilicon layer 1 is processed into a rectangular shape.

Figure 2B:
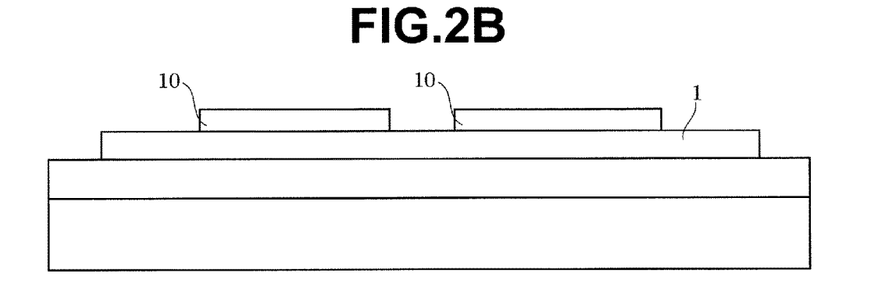

Next, as illustrated in FIG. 2B, a silicide block film 10, which is an insulating film, for example, an oxide film, is deposited on the polysilicon layer 1, and then the silicide block film 10 in regions in which the silicide layers are to be formed is removed by, for example, RIE. After that, in order to amorphize the polysilicon layer 1 in the regions in which the silicide layers are to be formed as needed, the impurities are injected so as to set the concentration to $1 \times 10^{19}/cm^3$ or more. In particular, in a case where the polysilicon layer 1 is as thick as, for example, about 150 nm, it is desired to add the step in order to further promote silicidation which makes complete silicidation of the corresponding parts of the polysilicon layer 1 in the thickness direction. In addition, for the purpose of promotion of silicidation, it is more preferred to adopt boron or $BF_2$ as the impurities. When the injected impurities for promotion of the silicidation are of the P-type, and the impurities for determining the resistivity of the above-mentioned polysilicon layer 1 is of the N-type, a PN junction is formed between the region in which the silicide layer is to be formed and the polysilicon layer 1. As a result, there is a fear in that the resistance values of the boundary surfaces become higher. However, in the first embodiment, the PN junction is not formed therebetween and the resistance value of the boundary surfaces does not become higher since silicidation of the polysilicon layer 1 including the impurities for promoting silicidation takes place later.

Figure 2C:
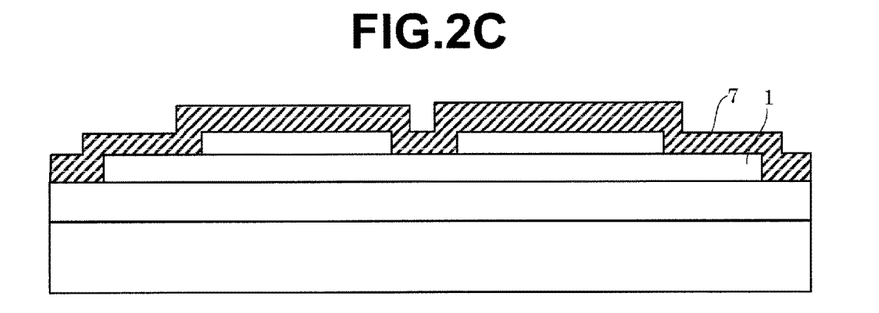

Next, as illustrated in FIG. 2C, a high-melting-point metal 7 is deposited on an upper surface. In order to make complete silicidation the polysilicon layer 1 in the regions in which the silicide layers are to be formed with the high-melting-point metal 7 in the subsequent step, it is preferred to set a thickness of the high-melting-point metal 7 to about half of the thickness of the polysilicon layer 1 or more.

Figure 2D:
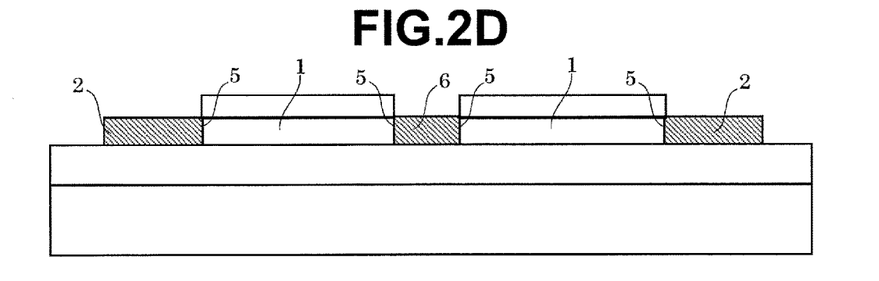

Next, after performing a short-time heat treatment, as illustrated in FIG. 2D, the silicide layers 2 and 6 are formed by reacting the high-melting-point metal 7 and the polysilicon layer 1 in only openings of the silicide block film 10. At this time, a temperature and time period for the heat treatment are set so that silicidation of the polysilicon layer 1 from the front surface to the bottom surface takes place. As the high-melting-point metal 7 of the first embodiment, titanium, cobalt, nickel, tungsten, or other such material can be used, for example. After that, the unreacted high-melting-point metal 7 remaining on the silicide block film 10 is removed.

With such silicidation treatment, it is possible to suppress addition of steps by performing the silicidation treatment of not only the silicide layers 2 and 6 but also a source, drain, and gate of a transistor (not shown) being a component of the semiconductor device at the same time. However, when the silicidation of the transistor is excessive, the film thickness of the silicide layer is close to a diffusion depth of the drain and source, thereby being unable to ignore junction leakage. In consideration of the circumstances, it is preferred that the thickness of the resistor be 150 nm or less.

In FIG. 2D and the subsequent steps, an interlayer insulating film (not shown) is formed on the polysilicon layers 1 and the silicide layers 2, and the contact plugs 12 are formed on the silicide layers 2 at the both ends of the resistor. Further, the upper metal wirings 4 serving as electrodes are formed on the contact plugs 12, with the result that the semiconductor device of the first embodiment illustrated in FIG. 1A and FIG. 1B is completed.

Figure 3:
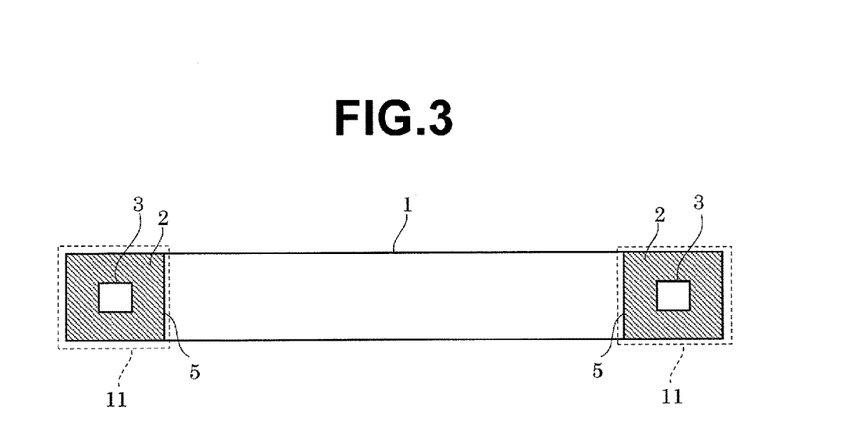
FIG. 3 is another plan view for illustrating the semiconductor device according to the first embodiment.
Figure 4:
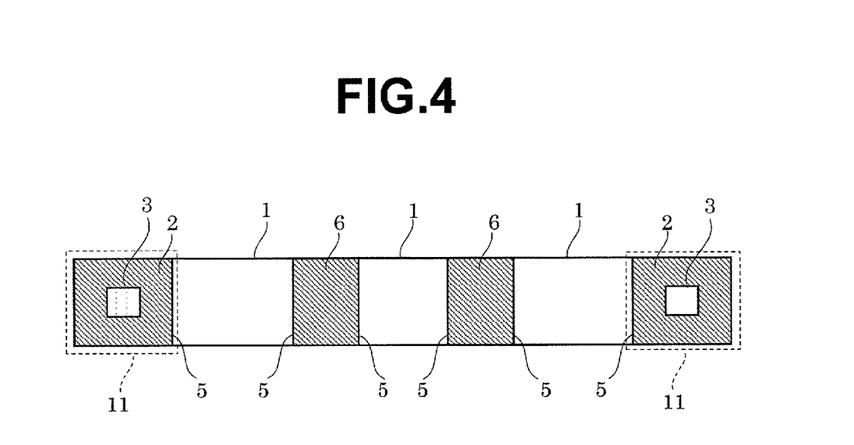
FIG. 4 is still another plan view for illustrating the semiconductor device according to the first embodiment.

In the description above, one silicide layer 6 of the first embodiment is formed in a region other than the contact regions 11 of the resistor, but the number of silicide layers 6 is not limited to one and may be set to any number. For example, FIG. 3 is a view for illustrating the resistor in a state in which the silicide layer 6 of FIG. 1A and FIG. 1B is absent. Specifically, FIG. 3 is a view for illustrating a case in which the number of silicide regions 6 formed in the region other than the contact regions 11 is zero. Further, FIG. 4 is a view for illustrating a structural example in a case in which two silicide layers 6 are formed. The number of added silicide layers 6 is not limited to the numbers in the structures of FIG. 1A and FIG. 1B, FIG. 3, and FIG. 4, and may be changed as needed. Moreover, a plurality of resistors, which have various numbers of silicide layers 6, may coexist in a single semiconductor device.

Next, description is made of the resistance value of the resistor of the first embodiment. Resistance value components of the resistor include contact resistance between the contact plugs and the silicide layers, silicide layer resistance, resistance of the boundary surfaces between the silicide layers and the polysilicon layers, and polysilicon layer resistance.

When it is assumed that those resistance value components are defined as a resistance value $Rc$, a resistance value $Rs$, a resistance value $Rb$, and a resistance value $Rp$, respectively, components used as the resistance values of the resistor in the first embodiment are the resistance value $Rb$ and the resistance value $Rp$. The resistance value $Rc$ and the resistance value $Rs$ are low enough to ignore in general as compared to the resistance value $Rb$ and the resistance value $Rp$, and hence the resistance value $Rc$ and the resistance value $Rs$ are not taken into account as the resistance values of the resistor.

The resistance value $Rb$ is a value dependent on a cross sectional area of the resistor, crystallinity of the boundary surfaces 5, or other factors, and is a value not dependent on lengths of the polysilicon layers 1 and the silicide layers 2 and 6. A value of the resistance value $Rp$ is proportional to the lengths of the polysilicon layers 1, and is inversely proportional to widths and thicknesses thereof.

For example, in the structure of FIG. 1A and FIG. 1B, two polysilicon layers 1 and four boundary surfaces 5 are present, and hence a resistance value $R$ of the resistor, which is a total of those portions, can be expressed by Expression (1) below. Here, $Rp1$ is a total resistance value which is a sum of the resistance values of two polysilicon layers 1 of FIG. 1A and FIG. 1B.

$$R = Rp1 + 4 \times Rb \quad (1)$$

Further, in the structure of FIG. 3, one polysilicon layer 1 and two boundary surfaces 5 are present, and hence a resistance value $R$ of the resistor, which is a total of those portions, can be expressed by Expression (2) below. Here, $Rp2$ is the resistance value of one polysilicon layer 1 of FIG. 3.

$$R = Rp2 + 2 \times Rb \quad (2)$$

Further, in the structure of FIG. 4, three polysilicon layers 1 and six boundary surfaces 5 are present, and hence a resistance value $R$ of the resistor, which is a total of those portions, can be expressed by Expression (3) below. Here, $Rp3$ is a total resistance value which is a sum of the resistance values of three polysilicon layers 1 of FIG. 4.

$$R = Rp3 + 6 \times Rb \quad (3)$$

In FIG. 1A and FIG. 1B, FIG. 3, and FIG. 4, each of the total lengths of the polysilicon layers 1 is different, and each of the resistance values of the polysilicon layers 1 is also different. Thus, the resistance values of the polysilicon layers 1 in the respective figures are distinguished as the resistance value $Rp1$, the resistance value $Rp2$, and the resistance value $Rp3$.

Incidentally, in general, after the semiconductor device is manufactured, when the resistance value of the resistor in the semiconductor device is deviated from a desired design value so that redesign is forcibly required, there is a need to remanufacture a resistor having less variation inexpensively and quickly by a method as simple as possible. As an example of adjusting methods for setting the resistance value of the resistor to the desired design value through redesign, a change in resistor width can be adopted. However, the change in resistor width, which is inversely proportional to the resistance value, is difficult to perform resetting because fluctuation range of the resistance value is excessively large. Further, as the resistor width becomes narrower, the resistance value becomes more liable to be varied due to an influence of a manufacture variation. Accordingly, in redesigning, adjustment of a resistor length which is proportional to the resistance value is suitable for design change.

However, the redesign affects a layout of a peripheral circuit, and hence a change in resistor length in an increasing direction is not allowable in many cases. Further, the change in shape itself such as the length or width of the resistor is subjected to an influence, for example, micro-loading effect, in the etching treatment. With this, the shape of the resistor is further changed, and the resistance value may be undesirably varied.

According to the first embodiment, in redesigning, it is possible to adjust a magnification of the resistance value by changing the number of boundary surfaces between the silicide layers and the polysilicon layers without changing the length or width of the resistor. Thus, the resistor having a stable resistance value can easily be provided.

Figure 5:
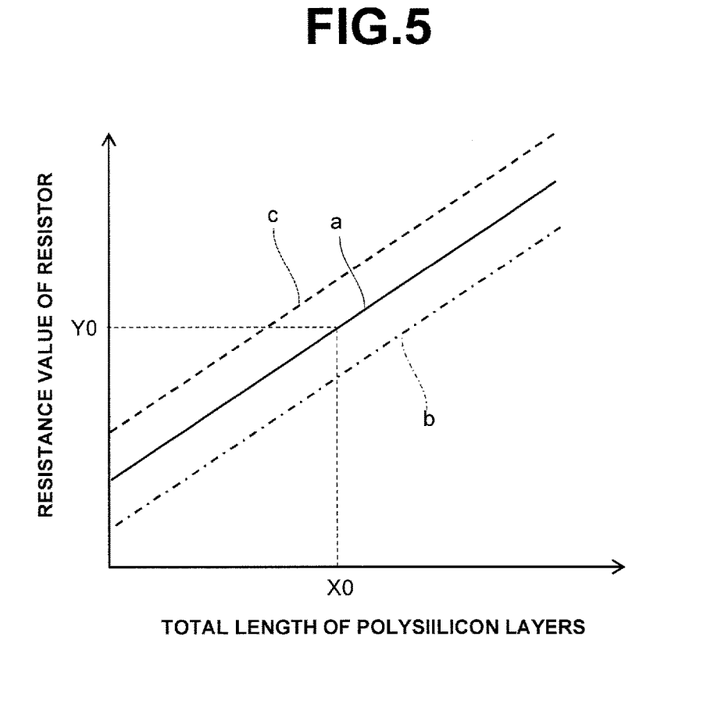
FIG. 5 is a graph for showing electrical characteristics of the semiconductor device according to the first embodiment.

With reference to FIG. 5, the method of adjusting the resistor of the first embodiment is described in detail below. FIG. 5 is a graph for showing a characteristic change in a case in which the horizontal axis represents the total length of the polysilicon layers, and the vertical axis represents the resistance value of the resistor. In this graph, characteristics of the solid line a, the dashed-dotted line b, and the dotted line c express Expression (1), Expression (2), and Expression (3) that are described above, which express the resistance values of the resistors corresponding to the structures of FIG. 1A and FIG. 1B, FIG. 3, and FIG. 4, respectively. Terms including the resistance value Rb in Expression (1), Expression (2), and Expression (3) are constant values, which are not dependent on the lengths of the polysilicon layers 1, and hence the terms are equivalent to a value of an intercept of the vertical axis. Meanwhile, the value of the horizontal axis of FIG. 5 corresponds to the total length of the polysilicon layers 1, and the resistance value Rp1, resistance value Rp2, and resistance value Rp3 change in accordance with the points on the horizontal axis. A change ratio of the resistance value of the resistor to a change in length of the polysilicon layers 1 is the same irrespective of the structures of FIG. 1A and FIG. 1B, FIG. 3, and FIG. 4, and hence inclinations of the solid line a, the dashed-dotted line b, and the dotted line c are the same as one another.

For example, in the solid line a being the characteristic line for showing a state of changing the resistance value of the resistor of the structure illustrated in FIG. 1A and FIG. 1B, when the polysilicon layer 1 has a length of zero, that is, a value of the intercept with the vertical axis corresponds to 4×Rb of Expression (1). Further, similarly, in the dashed-dotted line b being the characteristic line of the resistor of the structure illustrated in FIG. 3, a value of the intercept with the vertical axis corresponds to 2×Rb of Expression (2). Further, in the dotted line c being the characteristic line of the resistor of the structure illustrated in FIG. 4, a value of the intercept with the vertical axis corresponds to 6×Rb of Expression (3).

As described later, in order to use the resistance values of the boundary surfaces 5 for resistance value correction of the resistor, it is preferred that the resistance value of the boundary surfaces 5 be at least higher than a sheet resistance value of the polysilicon layers 1 because an adjusting range is broadened. In the experiment conducted by the inventor of the present invention, while the sheet resistance value of the polysilicon layers 1 was about 500 Ω/sq, the resistance value of the boundary surfaces 5 of about 1,000Ω was able to be obtained. Further, when the resistance value of the boundary surfaces 5 is desired to be increased, the resistance value can easily be increased by adopting the method of reducing the concentration of the impurities to be injected into the polysilicon layer 1, which has been described with reference to the manufacturing process.

In the first embodiment, when it is assumed that the structure of the resistor at the stage of design is the structure illustrated in FIG. 1A and FIG. 1B, and that a set value of the total length of the polysilicon layers 1 corresponds to X0 in the graph of FIG. 5, the resistance value can be predicted as Y0 on the solid line. Then, when the resistance value of the resistor is deviated from the desired design value due to any causes, the redesign of the resistor is performed by changing the number of silicide layers 6. For example, when the resistance value is higher than the design value Y0, the number of silicide layers 6 is reduced from the structure of FIG. 1A and FIG. 1B to the structure of FIG. 3, and the resistance value adjustment is performed on the characteristic line represented by the dashed-dotted line b. Meanwhile, when the resistance value is lower than the design value, the number of silicide layers 6 is increased by one from the structure of FIG. 1A and FIG. 1B to the structure of FIG. 4, and the resistance value adjustment is performed on the characteristic line represented by the dotted line c. The resistance value of the resistor is changed in proportion to the number of resistance values Rb based on Expression (1), Expression (2), and Expression (3) that are described above. Thus, change amount of the resistance value of the resistor can easily be predicted by checking in advance the resistance value Rb with, for example, trial manufacture.

Further, in addition to the above-mentioned method, the redesign of the resistor may be performed by further changing the length of the silicide layer 6 to adjust the lengths of the polysilicon layers 1, and increasing or reducing the resistance value. In FIG. 5, when the length of the polysilicon layers 1 is X0 and the resistance value of the resistor is Y0 at that time, the resistance value can be changed from the resistance value of the coordinate values (X0, Y0) to the resistance value in an upper right direction or in an lower left direction on the solid line by changing the length of the polysilicon layers 1.

Accordingly, the arbitrary resistance values on the arbitrary characteristic lines such as a, b, and c of FIG. 5 can freely be set by increasing or reducing the length of the polysilicon layers 1 at the same time of increasing or reducing the number of boundary surfaces 5. The change in resistance value under a state in which the shape of the resistor is not changed is performed by relatively changing the length of the polysilicon layers through change in length of the silicide layers in addition to the increase or reduction in number of boundary surfaces. When the boundary surfaces 5 and the length of the polysilicon layers 1 are changed to change the resistance value, the initial design of the resistor may have the structure without the silicide layer 6 as illustrated in FIG. 3. In particular, when the resistor having the low resistance value is desired to be manufactured, there is a case in which the silicide layer 6 cannot be formed because the resistance values of the boundary surfaces 5 are excessively high. As compared to the case in which the resistance value is reduced by increasing the width of the resistor while allowing the silicide layer 6 to remain formed, the structure of FIG. 3 is more suitable for manufacturing the resistor with a smaller area and low cost. In this case, as the design value of the resistance value at the stage of design, a certain point on the dashed-dotted line b of FIG. 5 is selected. Further, when readjustment in a direction of increasing the resistance value is required, the number of silicide layers 6 is increased, and the length of the polysilicon layers 1 is adjusted at the same time to select any values on the solid line a. In this manner, the resistance value of the resistor can be increased or reduced. Further, when readjustment in a direction of reducing the resistance value is required, the length of the polysilicon layers 1 is reduced without increasing the number of silicide layers 6, thereby being capable of selecting lower resistance value on the dashed-dotted line b.

Next, description is made of the method of manufacturing the semiconductor device including an adjustment process of the resistance value according to the first embodiment. In the first embodiment, with reference to the process flow described below, the semiconductor device including the resistor having the desired resistance value can be manufactured.

(A) Designing the semiconductor device to have the desired design value, and manufacturing the semiconductor device via the manufacturing process illustrated in FIG. 2A to FIG. 2D.

(B) Measuring the resistance value of the resistor, and comparing the measured resistance value with the design value.

(C) Redesigning the semiconductor device by increasing the number of silicide layers when the resistance value is lower than the design value, and by reducing the number of silicide layers when the resistance value is higher than the design value so that the resistance value becomes the design value.

(D) Manufacturing the semiconductor device again via the manufacturing process illustrated in FIG. 2A to FIG. 2D.

The manufacturing method described above is effective when the resistance value of the resistor is greatly different from the design value in the step of (B). As described above, in the first embodiment, the resistance value of the boundary surfaces 5 can be set high. Thus, through the increase or reduction in number of silicide layers formed in the resistor, the resistance value can drastically be changed without changing the shape of the resistor.

In the step of (C), redesigning is performed through the increase or reduction in number of silicide layers. However, as described above, two parameters, which are the number of silicide layers 6 and the length of the polysilicon layers 1, may be utilized to perform the adjustment.

In such a manufacturing method, there is an advantage in that it is possible to achieve both adjustment in a wide range (coarse adjustment) and adjustment with high accuracy (fine adjustment) in the case of changing the design value of the resistor. In the first embodiment, the change in the resistance value is large with respect to the number of resistors of the boundary surfaces 5, and the change in the resistance value is small with respect to the length of the silicide layers. The method by which the coarse adjustment of the resistance value is performed through the number of silicide layers 6 and the fine adjustment is performed through the length of silicide layers 6 is thereby easily implemented. For example, when the impurities introduced into the polysilicon layer 1 are of N-type, carrier mobility is high, and hence inclination of the characteristic becomes smaller than that of the P-type impurities. The change in resistance value of the resistor with respect to the change in polysilicon resistor length thus becomes smaller, and hence the adjusting method, by which the coarse adjustment and the fine adjustment that are described above are selectively used, is particularly effective.

Further, the resistor using the P-type impurities and the resistor using the N-type impurities may be connected in series to also serve as the resistor for the coarse adjustment of the resistance value and the resistor for the fine adjustment of the resistance value, respectively.

Further, the structure of the first embodiment is not limited to FIG. 1A and FIG. 1B, FIG. 3, and FIG. 4 as long as the silicide layer is formed at the portion other than the contact regions 11 of the resistor.

As describe above, in the first embodiment, there is no need to adjust the resistance value using the width of the resistor. Accordingly, there is no need to secure a large occupancy size in advance so as not to violate the minimum rule in assumption that the resistor width becomes narrower after the adjustment. Thus, it is possible to suppress the increase in chip area and the increase in cost along with the increase in chip area.

In the first embodiment, both when the resistance value becomes lower and when the resistance value becomes higher, the adjustment can be made through the change in the pattern of silicide layers. Therefore, the adjustment can be made only by modifying one photomask in the silicide layer formation step being the latter half of the manufacturing process, thereby being capable of suppressing the increase in development cost and the prolongation of a development period.

Figure 6:
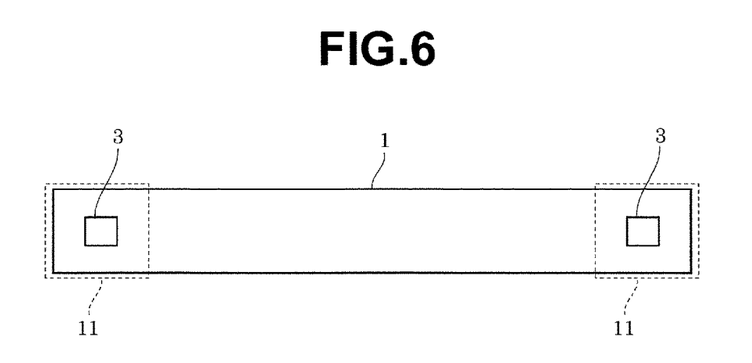
FIG. 6 is a plan view for illustrating a semiconductor device according to a second embodiment of the present invention.

FIG. 6 is a view for illustrating a second embodiment of the present invention, in which the silicide layers 2 formed in the contact regions 11 are omitted from the resistor illustrated in FIG. 3. In the structure of FIG. 6, the contact resistance value is increased due to absence of the silicide layers 2, however, the resistance value of the boundary surfaces 5 illustrated in FIG. 3 can be reduced. This structure is effective when the resistance value of the boundary surfaces 5 is excessively higher than the increase in contact resistance value through employment of the structure of FIG. 6 instead of the structure of FIG. 3. In particular, when the resistor having the low resistance value is desired to be manufactured, it is possible to manufacture the resistor with a smaller area and with lower cost using the structure of FIG. 6, as compared to the structure in which the width of the resistor is increased to lower the resistance value while forming the silicide layers 2 because the resistance value of the boundary surfaces 5 is excessively high.

The resistance value of the resistor at this time can be expressed by Expression (4) when the contact resistance value is low enough to be ignored.

$$R = Rp \tag{4}$$

Figure 7:
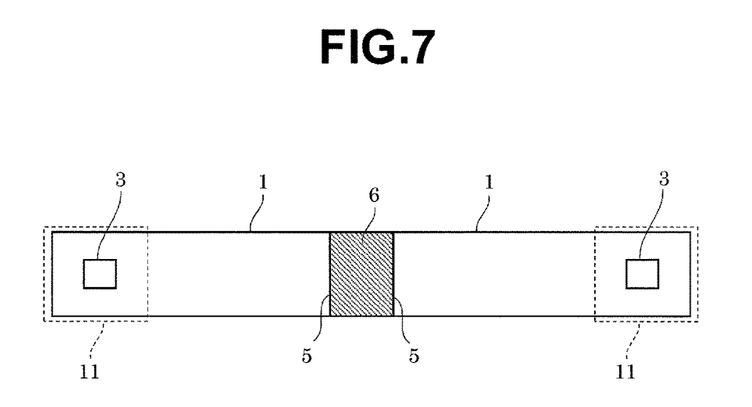
FIG. 7 is another plan view for illustrating the semiconductor device according to the second embodiment.

When the resistance value of the resistor of the structure illustrated in FIG. 6 is deviated from the design value, and redesign is required, the adjustment is made with the structure in which the silicide layer 6 is added as illustrated in FIG. 7. The number of silicide layers 6 is not limited to one as illustrated in FIG. 7. Similarly to the first embodiment, the number may be increased as needed. The resistance value of the resistor of FIG. 7 is the same as Expression (2) above. Further, the method of manufacturing the semiconductor device at that time is the same as the steps that are described above as process flows (A) to (D).

What is claimed is:

1. A semiconductor device, comprising:
   a resistor having a first dimension and a second dimension less than the first dimension so as to define a rectangular shape,
   the resistor comprising:
   a polysilicon layer including impurities;
   contact regions at both ends of the resistor, and including contact portions electrically connected to an upper metal wiring; and
   a silicide layer in at least one region of the resistor separated from the contact regions, in contact with the polysilicon layer via a boundary surface having a resistance value higher than a sheet resistance of the polysilicon layer, and having a width equal to a width of the polysilicon layer.

2. The semiconductor device according to claim 1, wherein the polysilicon layer has a thickness of 50 nm to 150 nm.

3. The semiconductor device according to claim 1, wherein the contact regions do not include the silicide layer.

4. The semiconductor device according to claim 2, wherein the contact regions do not include the silicide layer.

5. A method of manufacturing a semiconductor device, comprising:
   measuring a resistance value of the resistor in the semiconductor device of claim 2; and
   adjusting the resistance value so as to be equal to a design value by increasing a number of the silicide layers when the resistance value is lower than the design value, and by reducing the number of the silicide layers when the resistance value is higher than the design value.

6. The method of manufacturing a semiconductor device according to claim 5, further comprising adjusting the resistance value so as to be equal to the design value by reducing a length of the silicide layer when the resistance value is lower than the design value, and by increasing the length of the silicide layer when the resistance value is higher than the design value.

7. A method of manufacturing a semiconductor device, comprising:
   measuring a resistance value of a resistor in of a semiconductor device comprising:
   a resistor having a first dimension and a second dimension less than the first dimension so as to define a rectangular shape,
   the resistor comprising:
      a polysilicon layer including impurities;
      contact regions at both ends of the resistor, and including contact portions electrically connected to an upper metal wiring; and
      a silicide layer in at least at one region of the resistor other than the contact regions, in contact with the polysilicon layer via a boundary surface having a resistance value higher than a sheet resistance of the polysilicon layer, and having a width equal to a width of the polysilicon layer; and
   adjusting the resistance value so as to be equal to a design value by increasing a number of the silicide layers when the resistance value is lower than the design value, and by reducing the number of the silicide layers when the resistance value is higher than the design value.

8. The method of manufacturing a semiconductor device according to claim 7, further comprising adjusting the resistance value so as to be equal to the design value by reducing a length of the silicide layer when the resistance value is lower than the design value, and by increasing the length of the silicide layer when the resistance value is higher than the design value.

9. A semiconductor device, comprising:
   a resistor having a first dimension and a second dimension less than the first dimension so as to define a rectangular shape,
   the resistor comprising:
      a polysilicon layer including impurities;
      contact regions at both ends of the resistor, and including contact portions electrically connected to an upper metal wiring; and
      a silicide layer in at least one region of the resistor separated from the contact regions, in contact with the polysilicon layer via a boundary surface and having a width equal to a width of the polysilicon layer.

10. The semiconductor device according to claim 9, wherein the silicide layer is present from a front surface to a bottom surface of the resistor.

11. The semiconductor device according to claim 9, wherein the contact regions do not include the silicide layer.

12. The semiconductor device according to claim 9, wherein the polysilicon layer has a thickness of 50 nm to 150 nm.

\* \* \* \* \*

UNITED STATES PATENT AND TRADEMARK OFFICE
CERTIFICATE OF CORRECTION

PATENT NO. : 10,026,802 B1
APPLICATION NO. : 15/825862
DATED : July 17, 2018
INVENTOR(S) : Naoto Kobayashi It is certified that error appears in the above-identified patent and that said Letters Patent is hereby corrected as shown below:

On the Title Page

After (22) Filed: Nov. 29, 2017, insert -- (65) Prior Publication Data US 2018/0204903 A1 July 17, 2018 --.

Signed and Sealed this
Fourteenth Day of April, 2020

Andrei Iancu
*Director of the United States Patent and Trademark Office*